US009194692B1

(12) United States Patent
Beye et al.

(10) Patent No.: US 9,194,692 B1
(45) Date of Patent: Nov. 24, 2015

(54) SYSTEMS AND METHODS FOR USING WHITE LIGHT INTERFEROMETRY TO MEASURE UNDERCUT OF A BI-LAYER STRUCTURE

(71) Applicant: Western Digital (Fremont), LLC, Fremont, CA (US)

(72) Inventors: Robert W. Beye, Fremont, CA (US); Sean T. Poh, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/275,502

(22) Filed: May 12, 2014

Related U.S. Application Data

(60) Provisional application No. 61/913,223, filed on Dec. 6, 2013.

(51) Int. Cl.
*G01B 9/023* (2006.01)
*G01B 11/03* (2006.01)
*G01B 11/06* (2006.01)
*G03F 7/30* (2006.01)
*G01B 11/02* (2006.01)
*G01B 11/14* (2006.01)
*G01B 11/24* (2006.01)
*G01B 9/02* (2006.01)

(52) U.S. Cl.
CPC .......... *G01B 11/0675* (2013.01); *G01B 9/0209* (2013.01); *G01B 11/028* (2013.01); *G01B 11/14* (2013.01); *G01B 11/2441* (2013.01); *G03F 7/30* (2013.01)

(58) Field of Classification Search
CPC .. G01B 11/0675; G01B 9/0209; G01B 11/14; G01B 11/2441; G01B 11/028; G03F 7/30
See application file for complete search history.

(56) References Cited

U.S. PATENT DOCUMENTS

| | | | |
|---|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |

(Continued)

OTHER PUBLICATIONS

Kino et al. "Mirau correlation microscope", Appl. Opt. vol. 29(26) pp. 3775-3783 (Sep. 1990).*

(Continued)

*Primary Examiner* — Martin Angebranndt

(57) ABSTRACT

Systems and methods for using white light interferometry to measure undercut of a bi-layer structure are provided. One such method involves performing a first scan of a first bi-layer structure with a microscope using a first scan range, where the microscope is configured for white light interferometry, generating a first interferogram using data from the first scan, performing a second scan of the first bi-layer structure with the microscope using a second scan range, generating a second interferogram using data from the second scan, determining a first distance between features of the first interferogram, determining a second distance between features of the second interferogram, and calculating a width of the undercut based on the first distance and the second distance. One such system involves using the microscope and/or a computer to perform one or more actions of this method.

12 Claims, 8 Drawing Sheets

(56) References Cited

U.S. PATENT DOCUMENTS

| | | |
|---|---|---|
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,493,926 B2 | 12/2002 | Han et al. |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,545,763 B1 * | 4/2003 | Kim et al. .................. 356/503 |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,609,086 B1 | 8/2003 | Bao et al. |
| 6,611,398 B1 | 8/2003 | Rumpler et al. |
| 6,618,223 B1 | 9/2003 | Chen et al. |
| 6,629,357 B1 | 10/2003 | Akoh |

(56) References Cited

U.S. PATENT DOCUMENTS

| | | |
|---|---|---|
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |

(56) References Cited

U.S. PATENT DOCUMENTS

| | | |
|---|---|---|
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,948,636 B2 | 5/2011 | De Groot et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,035,812 B2 | 10/2011 | Shah |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |

(56) References Cited

U.S. PATENT DOCUMENTS

| | | |
|---|---|---|
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,502,979 B2 | 8/2013 | Levy et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 2003/0197872 A1 | 10/2003 | Littau et al. |
| 2003/0204325 A1 | 10/2003 | Niu et al. |
| 2010/0290157 A1 | 11/2010 | Zhang et al. |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0224183 A1 | 9/2012 | Fay et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |

OTHER PUBLICATIONS

Golden et al. "Optimization of bi-layer lift-off resist process", CS mantech. technical digest 4 pages (2009).*

Kitagawa "3-D profiling of a transparent film using white light interferometry", SICE Annual conference 2004 pp. 585-590 (2004).*

Poelma et al. "A numerical experimental approach for characterizing the elastic properties of thin films: application of nanocantilevers", J. Micromech. Microeng., vol. 21 065003 (11 pages) (Apr. 2011).*

Gale et al., "Linnik microscope imaging of integrated cicuit structures", Appl. Opt., vol. 35(1) pp. 131-148 (Jan. 1996).*

Lee et al., "Profilometry with coherence scanning microscope", Appl. Opt., vol. 29(26) pp. 3784-3788 (Sep. 1990).*

Lobera et al., "Limitations and innovations in scanning white light inteferometry", Proc. euspen 2008 vol. 2 pp. 287-291 plus 1 page associated abstract ) (2008).*

* cited by examiner

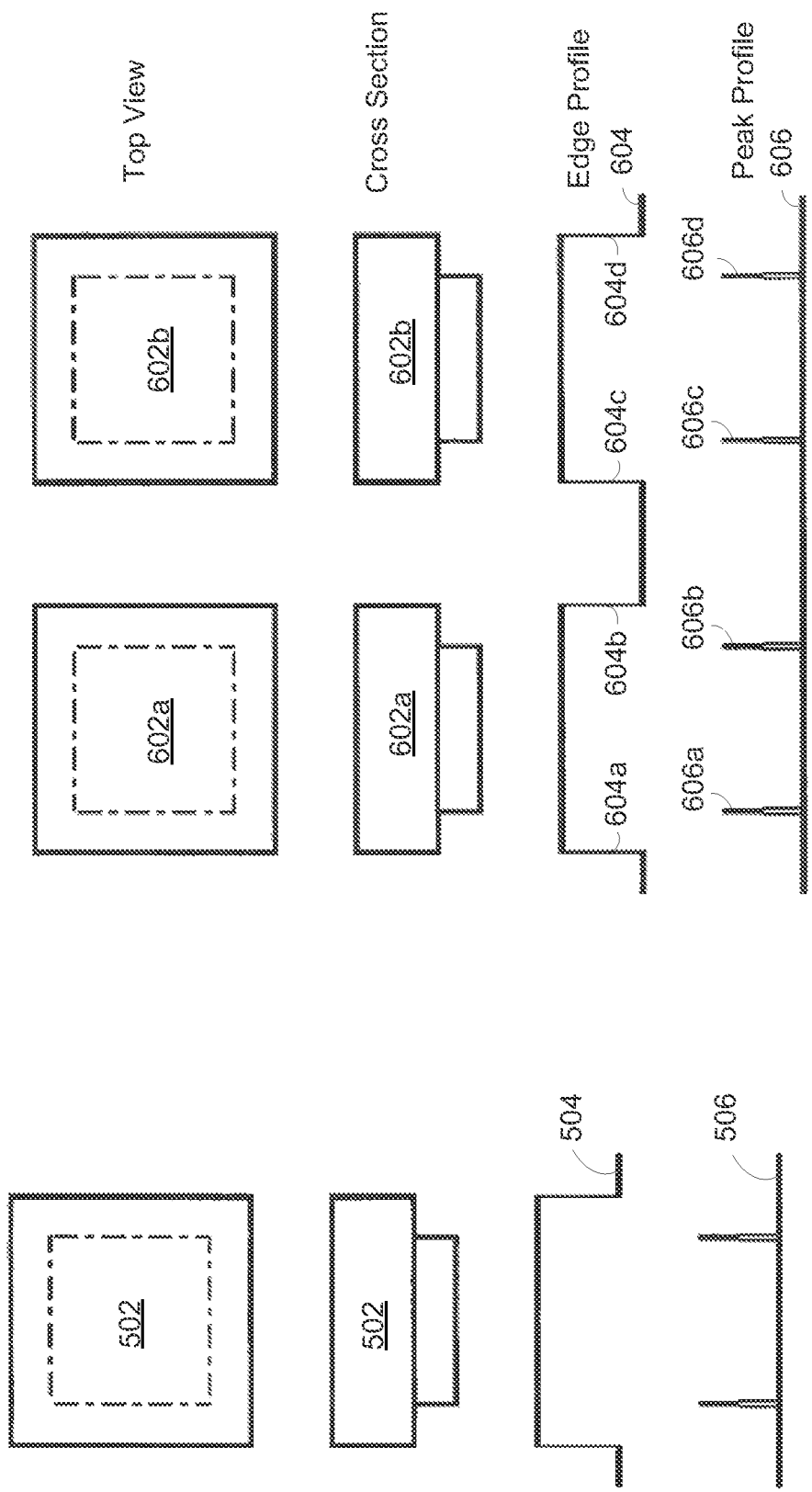

SYSTEMS AND METHODS FOR USING WHITE LIGHT INTERFEROMETRY TO MEASURE UNDERCUT OF A BI-LAYER STRUCTURE

CROSS-REFERENCE TO RELATED APPLICATION(S)

This application claims priority to and the benefit of U.S. Provisional Application No. 61/913,223 filed on Dec. 6, 2013, and entitled, "SYSTEMS AND METHODS FOR USING WHITE LIGHT INTERFEROMETRY TO MEASURE UNDERCUT OF A BI-LAYER STRUCTURE", the entire content of which is incorporated herein by reference.

BACKGROUND

Lift-off processes and bi-layer structures are commonly used in the fabrication of surface features on semiconductor substrates/wafers. A parameter of great interest for the bi-layer structures used in the lift-off processes is the undercut, or the distance that the upper layer cantilevers beyond the lower layer. Undercut photoresist structures are used in the semiconductor industry and more particularly in the metal lift-off process as a means of providing a template for metal deposition while minimizing the occurrence of defects such as 'fencing'. Such defects are the result of the deposited material blanketing both the intended substrate area and the template itself. Removal of the template material then leaves deposited material extending beyond its intended limits. By providing a gap between the substrate and the template by way of an undercut, such defects can be minimized. The amount or width of an undercut should generally be large enough to provide the necessary discontinuity but not so large as to compromise the structural integrity of the template feature.

The bi-layer structure itself often consists of a layer of photoresist over a bottom layer, such as polymethylglutarimide (PMGI), whose dimensions may be tailored through the developer process. Before exposure to developer, both the photoresist and the bottom layer possess the same lateral dimensions. Exposure to photo developer degrades the bottom layer from the outside-in, thereby undercutting the photoresist as a function of time.

The standard method for monitoring undercut (e.g., with widths of less than about 1-2 microns or "um") involves using a focused ion beam and a scanning electron microscope (FIB/SEM), where undercut parameters such as width are directly obtained from the cross-sectional images of the bi-layer structure. Although the FIB/SEM method for undercut metrology provides a reasonable characterization of the undercut structure, the method is limited due to high capital expenses, service expenses, and operator expenses combined with inherently long processing times associated with the FIB/SEM bi-layer metrology. Further, the FIB/SEM method is a destructive process, thereby requiring the use of sampling to estimate the parameters of the device population. Accordingly, an improved system and method for measuring undercut is needed.

BRIEF DESCRIPTION OF THE DRAWINGS

FIG. 2a is a schematic top view of the bi-layer structure of FIG. 1 having an undercut to be measured using white light interferometry in accordance with one embodiment of the invention.

FIG. 2b is a schematic cross sectional view of the bi-layer structure of FIG. 2a and undercut to be measured using white light interferometry in accordance with one embodiment of the invention.

FIG. 8a illustrates top and cross sectional views of a first bi-layer structure having an undercut to be measured using white light interferometry along with graphs of the corresponding measurements (interferograms) of the outer edges ("Edge profile") and the inner edges ("Peak profile") in accordance with one embodiment of the invention.

FIG. 8b illustrates top and cross sectional views of two adjacent bi-layer structures having an undercut to be measured using white light interferometry along with graphs of the corresponding measurements (interferograms) of the outer edges ("Edge profile") and the inner edges ("Peak profile") in accordance with one embodiment of the invention.

DETAILED DESCRIPTION

Figure 1:
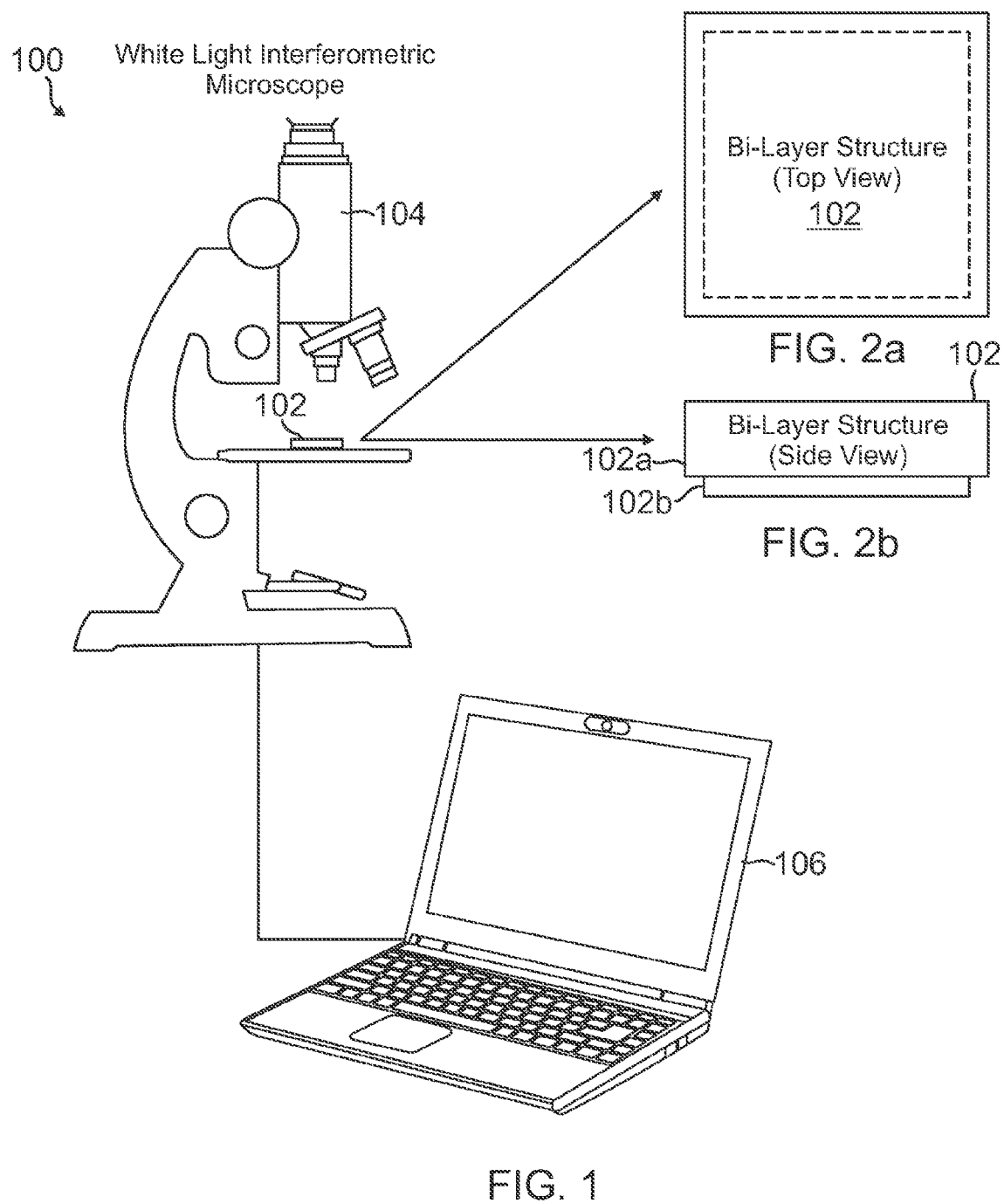
FIG. 1 is a schematic diagram of a system for using white light interferometry to measure an undercut of a bi-layer structure including a microscope coupled to a computer in accordance with one embodiment of the invention.

For relatively large undercut dimensions, standard light microscopes may be used to view the bi-layer structures top-down. Edges at the outer extent of the entire structure and the inner extent of the undercut are represented by fringes whose appearance is a function of focus. Optimal focus is difficult to determine as the outer and inner points of the undercut structure are found at different focal planes. Undercut is therefore determined through a two image technique or by selecting a compromise focus setting in a single image. However, at smaller undercut dimensions (e.g., at about 1 to 2 microns), the fringes of outer and inner edges begin to overlap, limiting the capability of this technique.

In addressing these disadvantages and those described in the background section above, it has been determined that white-light interferometry (WLI) may be used for undercut metrology as measured undercut values display a substantially linear relationship to those obtained by FIB/SEM measurements for undercut values above about 0.3 microns (um) and up.

Referring now to the drawings, embodiments of systems and methods for measuring an undercut of bi-layer structures on a wafer are illustrated. The methods can involve using white light interferometry in a two stage process to measure bi-layer undercut. In such case, the inner edges of the undercut can generate sharp peaks in an interferogram while the outer edges are found at the points of maximum slope (e.g., edges) in a second interferogram. These edges and peaks can be used to determine the width of the undercut (e.g., on a semiconductor wafer). If the measured width is outside of acceptable parameters for fabrication of the wafer, the fabrication process can be changed accordingly. The systems can include a microscope configured for white light interferometry and a computer configured to calculate the undercut width based on the locations of the edges and peaks in the interferograms from the microscope. As a result, the systems and methods described herein can provide fast, inexpensive, and non-destructive techniques that show promise to greatly reduce metrology costs and to improve yields.

FIG. 1 is a schematic diagram of a system 100 for using white light interferometry to measure an undercut of a bi-layer structure 102 including a microscope 104 coupled to a computer 106 in accordance with one embodiment of the invention. The bi-layer structure 102 is positioned on the stage of the microscope 104 and is thus ready to be analyzed using white light interferometry. In several embodiments, the bi-layer structure 102 is one of a plurality of such structures positioned on a wafer.

FIG. 2a is a schematic top view of the bi-layer structure 102 of FIG. 1 having an undercut to be measured using white light interferometry in accordance with one embodiment of the invention.

FIG. 2b is a schematic cross sectional view of the bi-layer structure 102 of FIG. 2a and undercut to be measured using white light interferometry in accordance with one embodiment of the invention. As can be seen in FIGS. 2a and 2b, the bi-layer structure 102 consists of an upper layer cantilevered over a lower layer, where the area of the lower layer is less than that of the upper layer. The undercut is defined by the outer edge 102a of the upper layer as it extends to the outer edge 102b (e.g., depicted as dashed line in FIG. 2a) of the lower layer.

Referring now to FIGS. 1, 2a, and 2b, in operation, the microscope 104 can perform a first scan of the bi-layer structure 102 using a first scan range and perform a second scan of the bi-layer structure 102 using a second scan range. In several embodiments, the first scan range and the second scan range relate to a depth of scanning in a direction normal to the top surface of the bi-layer structure 102. In one embodiment, the first scan range can be sufficiently high as to sense the location of the outer edge 102a of the upper layer of the bi-layer structure 102. In such case, the second scan range can be sufficiently high as to sense the outer edge 102b of the lower layer of the bi-layer structure 102. In some instances the outer edge 102b of the lower layer can be referred to as the inner edge of the bi-layer structure 102. In such case, the first scan range can be less than the second scan range. In other embodiments, the second scan range can be less than the first scan range and the functional roles can be reversed (e.g., first scan senses inner edge and second scan senses outer edge).

Returning now to the operation, the microscope 104 can also generate a first interferogram using data obtained from the first scan and generate a second interferogram using data obtained from the second scan. The interferograms can be thought of as graphs of thickness versus position resulting from the white light interferometry measurements. As will be discussed in greater detail below, certain features in the interferograms can be used to determine an approximate width between the outer edge 102a and the inner edge 102b that define the undercut. The computer 106 can obtain the first and second interferograms from the microscope 104 and then determine a first distance between the certain features of the first interferogram. The computer 106 can also determine a second distance between features of the second interferogram, and calculate a width of the undercut based on the first distance and the second distance.

In some embodiments, the system can be used to measure an undercut having a width in a range of about 0.3 to about 1.3 microns. In one such case, the undercut is intended for use in a metal deposition process.

In this context, the computer 106 refers to any machine or selection of logic that is capable of executing a sequence of instructions and should be taken to include, but not limited to, general purpose computers such as a laptop, general purpose microprocessors, special purpose microprocessors, central processing units (CPUs), digital signal processors (DSPs), application specific integrated circuits (ASICs), signal processors, microcontrollers, and other suitable circuitry. Further, it should be appreciated that the term processor, microprocessor, circuitry, controller, and other such terms, refer to any type of logic or circuitry capable of executing logic, commands, instructions, software, firmware, functionality, or other such information.

In some embodiments, the computer 106 is integrated within the microscope 104 such that there is no external computer and all of the processing can be performed using the microscope. In several embodiments, the microscope 104 can be any suitable microscope configured for white light interferometry.

Figure 3:
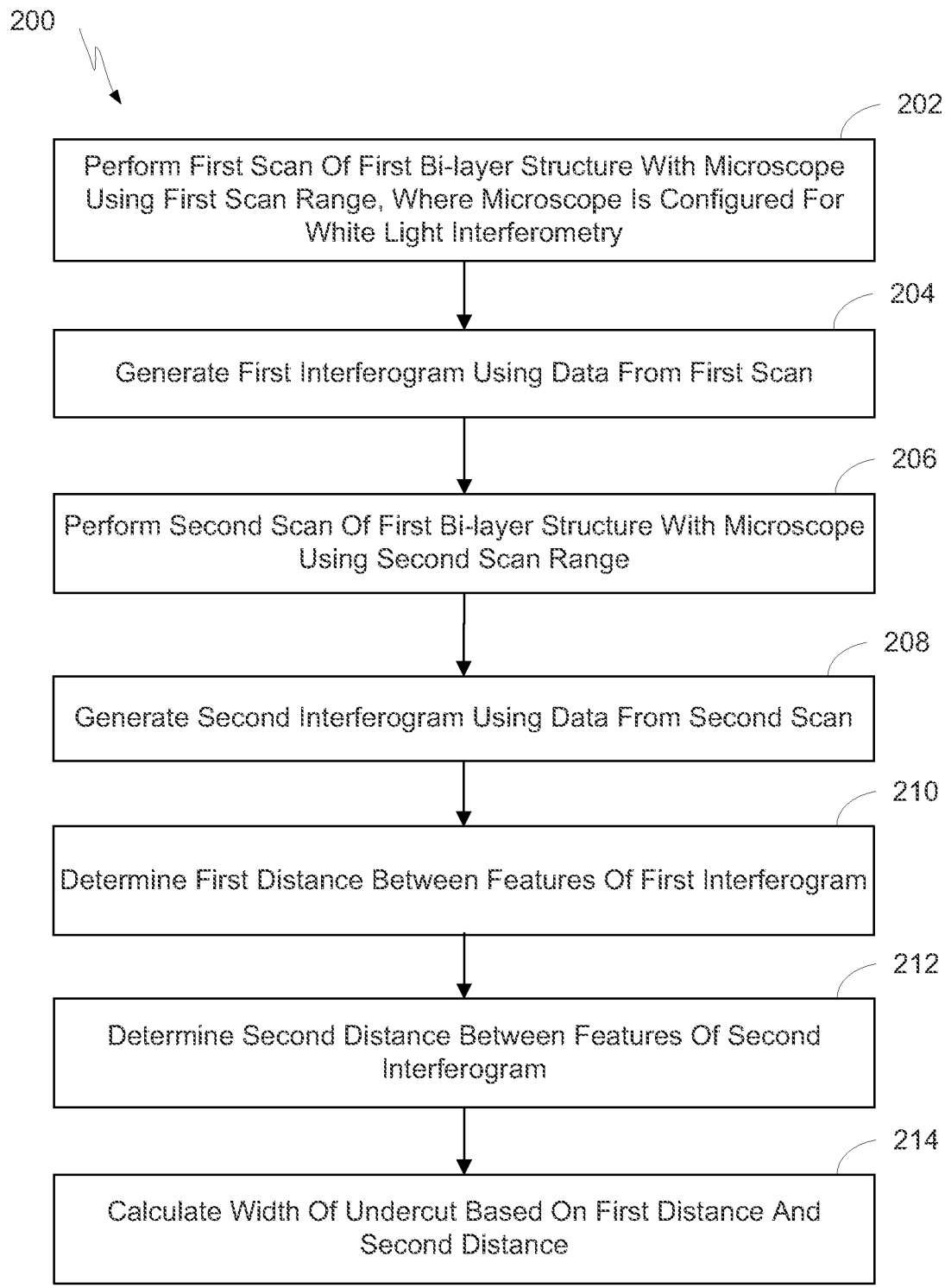
FIG. 3 is a flowchart illustrating a process for using white light interferometry to measure an undercut of a bi-layer structure in accordance with one embodiment of the invention.

FIG. 3 is a flowchart illustrating a process 200 for using white light interferometry to measure an undercut of a bi-layer structure in accordance with one embodiment of the invention. In particular embodiments, the process 200 can be performed using the microscope and computer of FIG. 1, or possibly using only the microscope. In block 202, the process first performs a first scan of a first bi-layer structure with a microscope using a first scan range, where the microscope is configured for white light interferometry. In block 204, the process generates a first interferogram using data from the first scan. In block 206, the process performs a second scan of the first bi-layer structure with the microscope using a second scan range. In block 208, the process generates a second interferogram using data from the second scan. In block 210, the process determines a first distance between features of the first interferogram. In block 212, the process determines a second distance between features of the second interferogram. In block 214, the process calculates a width of the undercut based on the first distance and the second distance.

In one embodiment, the first scan range is less than the second scan range. In such case, the process first senses the outer edge of the undercut and then senses the inner edge. In another embodiment, the second scan range is less than the first scan range. In such case, the process first senses the inner edge of the undercut and then senses the outer edge. In several embodiments, the first and second ranges extend in a direction that is about normal to a top surface of the bi-layer structure defining the undercut.

In several embodiments, the process 200 further includes modifying a fabrication process for forming the bi-layer structure if the width of the undercut is outside of a preselected range. In one such case, the process can further include adjusting a duration of a development sub-process used in forming the undercut of the first bi-layer structure.

In several embodiments, the first interferogram includes a rectangularly shaped waveform where edges thereof correspond in position to outer edges of the undercut being measured. In such case, the second interferogram can include two peaks where each corresponds in position to an inner edge of the undercut being measured. In some embodiments, the second interferogram includes the rectangularly shaped waveform and the first interferogram includes the two peaks. In other embodiments, other combinations of these shapes may be found in the interferograms. A number of possible interferogram shapes and bi-layer structures are described below in reference to FIGS. 8a, 8b, 9a, and 9b.

In a number of embodiments, the bi-layer structures are scanned and data from the scans is extracted in both an X-direction and a Y-direction for each of the first scan and the second scan, where X and Y are about orthogonal to one another. In several embodiments, the process can determine the difference in position between the edges and peaks in the X-direction and can determine the difference in position between the edges and peaks in the Y-direction and then compute an average difference for the width of the undercut. In some embodiments, where the bi-layer structure is symmetric about the X and Y directions (e.g., a square), the process can make the computations in just one of the X and Y directions to determine the undercut width.

The examples that follow will provide more specific details on these computations and the potential shapes for the bi-layer structures.

In one embodiment, the process 200 is a sub-process of a larger fabrication process that includes providing the wafer, depositing a lower layer of polymethylglutarimide (PMGI) on the wafer, depositing an upper layer of photo resist on the lower layer, patterning the lower layer and the upper layer, where the patterning involves developing the lower layer and the upper layer to form the first bi-layer structure, and then performing the process 200 for using white light interferometry to measure the undercut.

In several embodiments, the systems and methods described herein can be used in conjunction with a number of fabrication processes for processing semiconductor wafers, and particularly those that involve plating. In some embodiments, the methods described herein are applied after a wafer has been fabricated. In one embodiment, the methods described herein are applied during wafer fabrication.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 4:
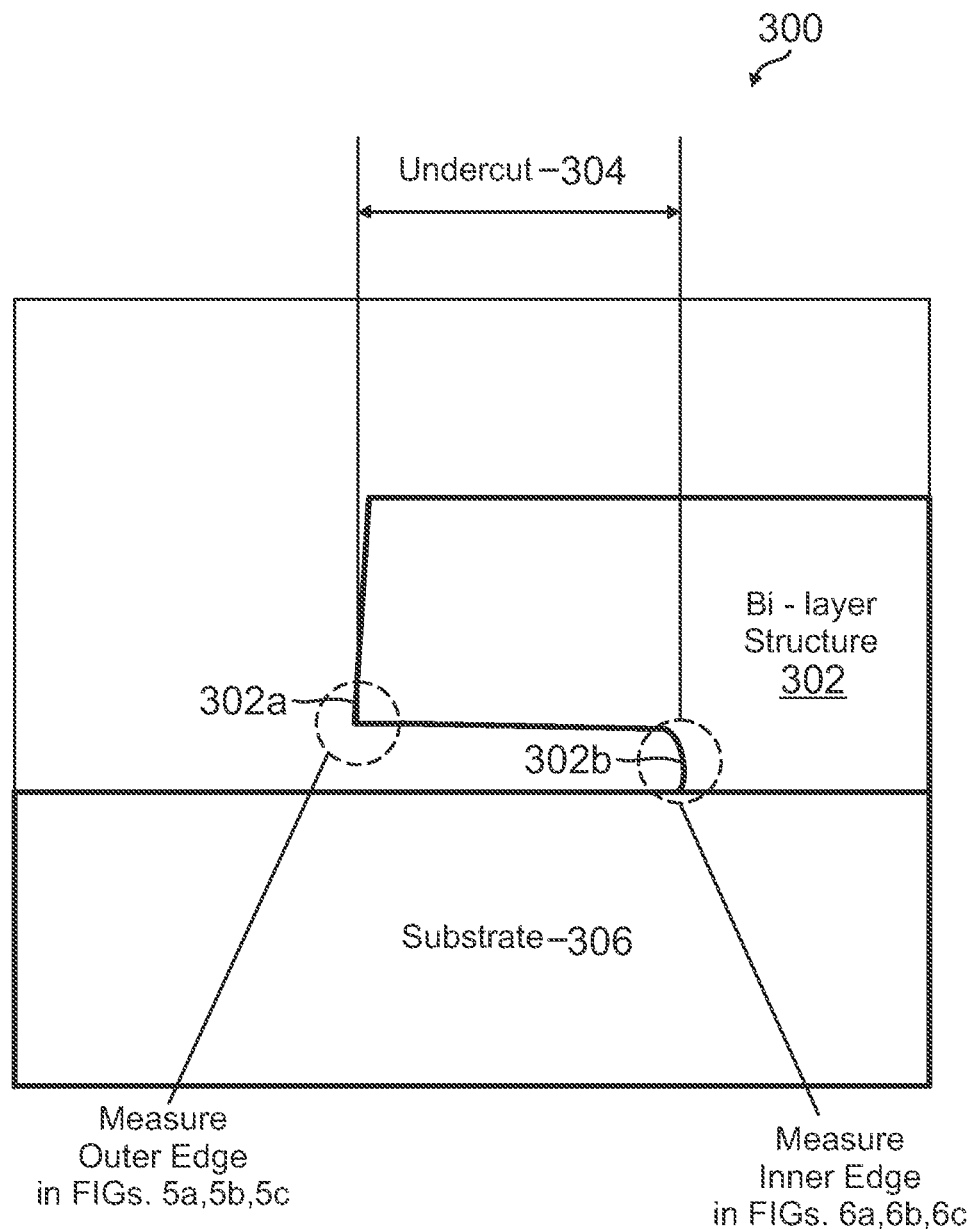
FIG. 4 is an expanded cross sectional view of an edge area of a bi-layer structure showing the locations of inner and outer edges of an undercut used to determine a width of the undercut in accordance with one embodiment of the invention.

FIG. 4 is an expanded cross sectional view 300 of an edge area of a bi-layer structure 302 showing the locations of an outer edge 302a and an inner edge 302b of an undercut 304 used to determine a width of the undercut in accordance with one embodiment of the invention. The bi-layer structure 302 is disposed on a substrate 306 (e.g., a wafer). As indicated in FIG. 4, the techniques for measuring the outer edge 302a and inner edge 302b will be discussed in further detail when FIGS. 5a, 5b, 5c, 6a, 6b, and 6c are described below. In several embodiments, the substrate/wafer 306 is made of silicon and the bi-layer structure 302 is formed of an upper layer of photo resist on a lower layer of PMGI. In several embodiments, the position of the inner edge 302b is a function of the duration of the development stage of the bi-layer structure fabrication process, where the greater the duration, the greater the undercut width.

Figure 5B:
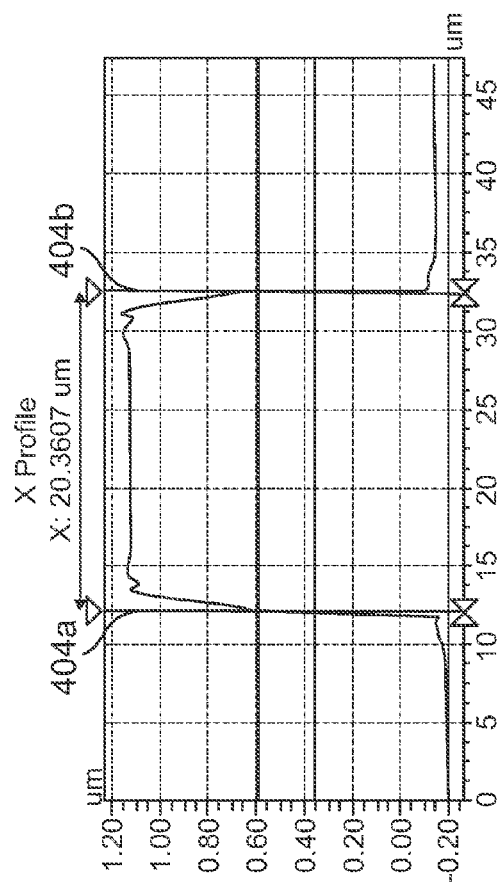
FIG. 5b is a graph of thickness versus position (interferogram) along the X-axis of the bi-layer structure of FIG. 5a that can be used to determine the X-axis width between the outer edges of the undercut in accordance with one embodiment of the invention.
Figure 5C:
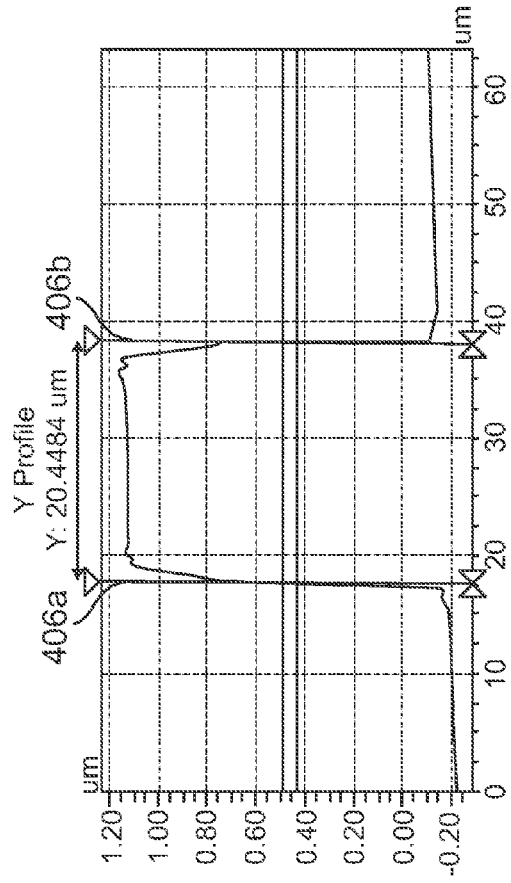
FIG. 5c is a graph of thickness versus position (interferogram) along the Y-axis of the bi-layer structure of FIG. 5a that can be used to determine the Y-axis width between the outer edges of the undercut in accordance with one embodiment of the invention.
Figure 5A:
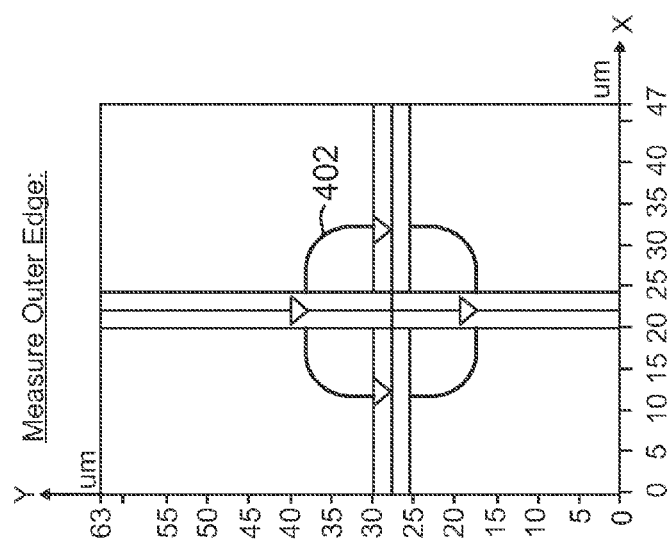
FIG. 5a is a top view of a bi-layer structure having an undercut, where the outer edges of the undercut are to be located using white light interferometry scans (interferograms) having a first range in a direction extending into the page (Z-axis direction) in accordance with one embodiment of the invention.

FIG. 5a is a top view of a bi-layer structure 402 having an undercut, where the outer edges of the undercut are to be located using white light interferometry scans (interferograms) having a first range in a direction extending into the page (Z-axis direction) in accordance with one embodiment of the invention. A coordinate system (e.g., Cartesian coordinate system) has been superimposed near the bi-layer structure 402 to illustrate relative position of the edges of the bi-layer structure 402. The coordinate system includes an X-axis (horizontal axis) measured in microns or "um" and a Y-axis (vertical axis) also measured in microns or "um".

FIG. 5b is a graph of thickness versus position (interferogram) along the X-axis (horizontal axis) of the bi-layer structure 402 of FIG. 5a that can be used to determine the X-axis width between the outer edges of the undercut in accordance with one embodiment of the invention. As can be seen in FIG. 5b, the interferogram has a number of features reflecting a substantially rectangular shape. In several embodiments, the process of FIG. 3 determines a distance between features in the first interferogram in block 210 by locating the edges (404a, 404b) of the rectangular shape. To locate the edges (404a, 404b), the process determines the locations having a maximum slope (e.g., a roughly vertical orientation corresponding to about maximum slope) across the interferogram. The edges (404a, 404b) of the rectangular shape in the interferogram correspond in position to the outer edges of the bi-layer structure 402 taken along the X-axis direction. As can be seen in FIG. 5b, the X-axis width of the outer edge of the undercut is 20.3607 um as defined by those edges (404a, 404b).

FIG. 5c is a graph of thickness versus position (interferogram) along the Y-axis (vertical axis) of the bi-layer structure 402 of FIG. 5a that can be used to determine the Y-axis width between the outer edges of the undercut in accordance with one embodiment of the invention. As can be seen in FIG. 5c, the interferogram has a number of features reflecting a substantially rectangular shape. In several embodiments, the process of FIG. 3 determines a distance between features in the first interferogram in block 210 by locating the edges (406a, 406b) of the rectangular shape. To locate the edges (406a, 406b), the process determines the locations having a maximum slope (e.g., a roughly vertical orientation corresponding to about maximum slope) across the interferogram. The edges (406a, 406b) of the rectangular shape in the interferogram correspond in position to the outer edges of the bi-layer structure 402 taken along the Y-axis direction. As can be seen in FIG. 5c, the Y-axis width of the outer edge of the undercut is 20.4484 um defined by those edges (406a, 406b).

Figure 6B:
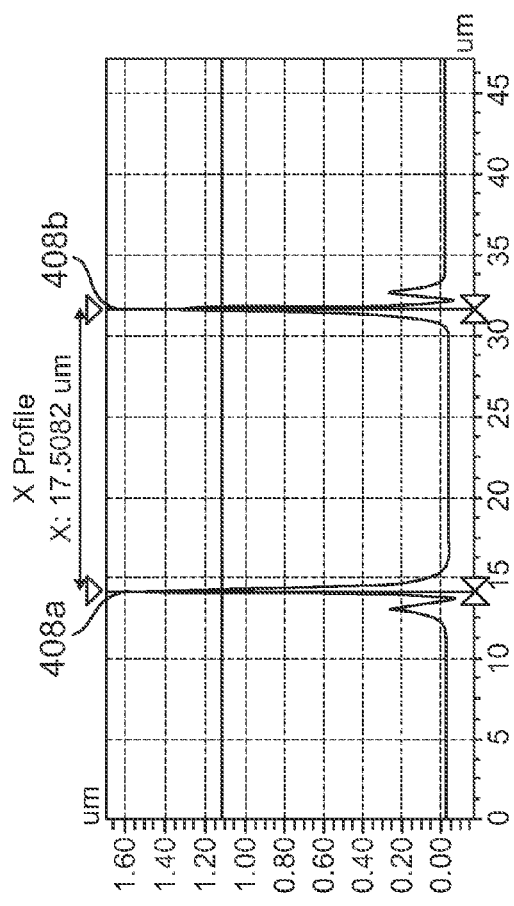
FIG. 6b is a graph of thickness versus position (interferogram) along the X-axis of the bi-layer structure of FIG. 6a that can be used to determine the X-axis width between the inner edges of the undercut in accordance with one embodiment of the invention.
Figure 6C:
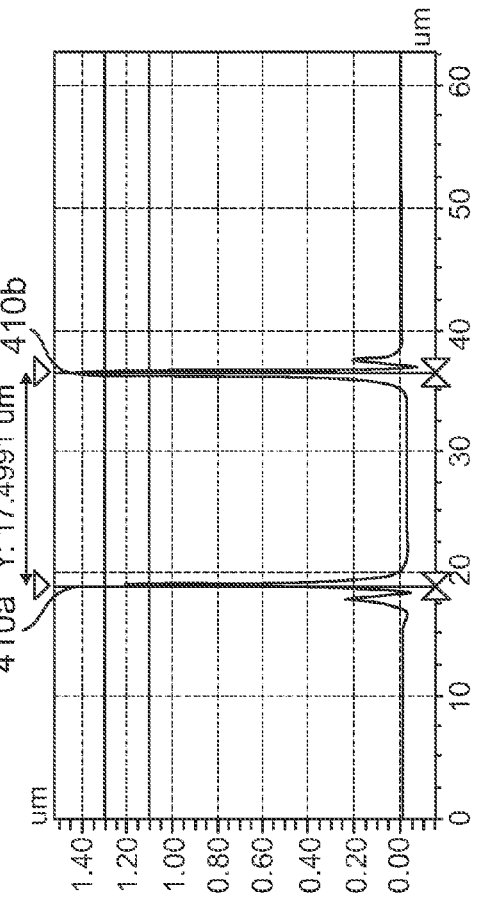
FIG. 6c is a graph of thickness versus position (interferogram) along the Y-axis of the bi-layer structure of FIG. 6a that can be used to determine the Y-axis width between the inner edges of the undercut in accordance with one embodiment of the invention.
Figure 6A:
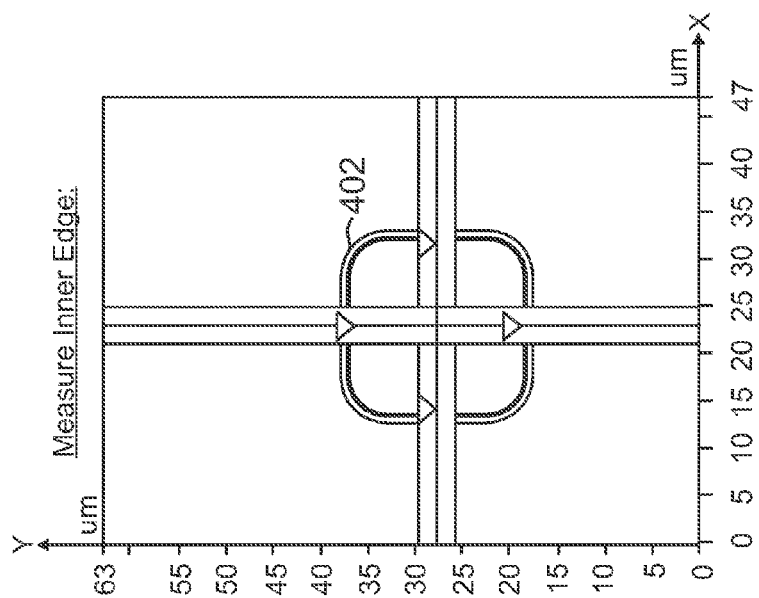
FIG. 6a is a top view of the bi-layer structure of FIG. 5a, where the inner edges of the undercut are to be located using white light interferometry scans (interferograms) having a second range in the Z-axis direction in accordance with one embodiment of the invention.

FIG. 6a is a top view of the bi-layer structure 402 of FIG. 5a, where the inner edges of the undercut are to be located using white light interferometry scans (interferograms) having a second range in the Z-axis direction in accordance with one embodiment of the invention. Note that the inner edges of the undercut of the bi-layer structure 402 are depicted with the thicker line that is within the outer perimeter of the bi-layer structure 402. Similar to FIG. 5a, a coordinate system (e.g., Cartesian coordinate system) has been superimposed near the bi-layer structure 402 to illustrate relative position of the edges of the bi-layer structure 402. The coordinate system includes an X-axis (horizontal axis) measured in microns or "um" and a Y-axis (vertical axis) also measured in microns or "um". In the embodiment of FIG. 6a, the second scan range is greater than the first scan range used for FIGS. 5a, 5b, and 5c.

FIG. 6b is a graph of thickness versus position (interferogram) along the X-axis of the bi-layer structure 402 of FIG. 6a that can be used to determine the X-axis width between the inner edges of the undercut in accordance with one embodiment of the invention. As can be seen in FIG. 6b, the interferogram has a number of features including two well defined peaks (408a, 408b). In several embodiments, the process of FIG. 3 determines a second distance between features of the second interferogram in block 212 by locating the peaks (408a, 408b). To locate these peaks (408a, 408b), the process determines the two locations having about peak amplitude (e.g., about maximum amplitude) across the interferogram. The peaks (408a, 408b) in the interferogram correspond in position to inner edges of the undercut of the bi-layer structure 402 taken along the X-axis direction. As can be seen in FIG. 6b, the X-axis width of the inner edge of the undercut is 17.5082 um as defined by those peaks (408a, 408b).

FIG. 6c is a graph of thickness versus position (interferogram) along the Y-axis (vertical axis) of the bi-layer structure 402 of FIG. 6a that can be used to determine the Y-axis width between the inner edges of the undercut in accordance with one embodiment of the invention. As can be seen in FIG. 6c, the interferogram has a number of features including two well defined peaks (410a, 410b). In several embodiments, the process of FIG. 3 determines a second distance between features of the second interferogram in block 212 by locating the peaks (410a, 410b). To locate these peaks (410a, 410b), the process determines the two locations having about peak amplitude (e.g., about maximum amplitude) across the interferogram. The peaks (410a, 410b) in the interferogram correspond in position to inner edges of the undercut of the bi-layer structure 402 taken along the Y-axis direction. As can be seen in FIG. 6c, the Y-axis width of the inner edge of the undercut is 17.4991 um as defined by those peaks (410a, 410b).

To avoid the need for absolute positions in each scan, a symmetric undercut feature is examined in FIGS. 5a and 6a and the undercut can simply be determined by the width between the outer edges minus the width between the inner edges divided by two. More specifically, in several embodiments, the process of FIG. 3 calculates a width of the undercut based on the first distance and the second distance in block 214 by subtracting the respective X and Y profile widths, dividing by two, and averaging the undercut widths. For example, the average undercut for the examples of FIGS. 5a and 6a is given by the average of (20.3607–17.5082)/2 and (20.4484–17.4991)/2, which comes to 1.45045 um. In some cases, averaging X-axis and Y-axis widths may be unnecessary. For example, in one such case, the bi-layer structure is symmetric (e.g., having a square shape).

To test the applicability of this method, features with undercut dimensions ranging from about 0.3 um to about 1.3 um were made and measured using both FIB/SEM methods and the proposed white light interferometry methods. The resulting correlation is shown in FIG. 7.

Figure 7:
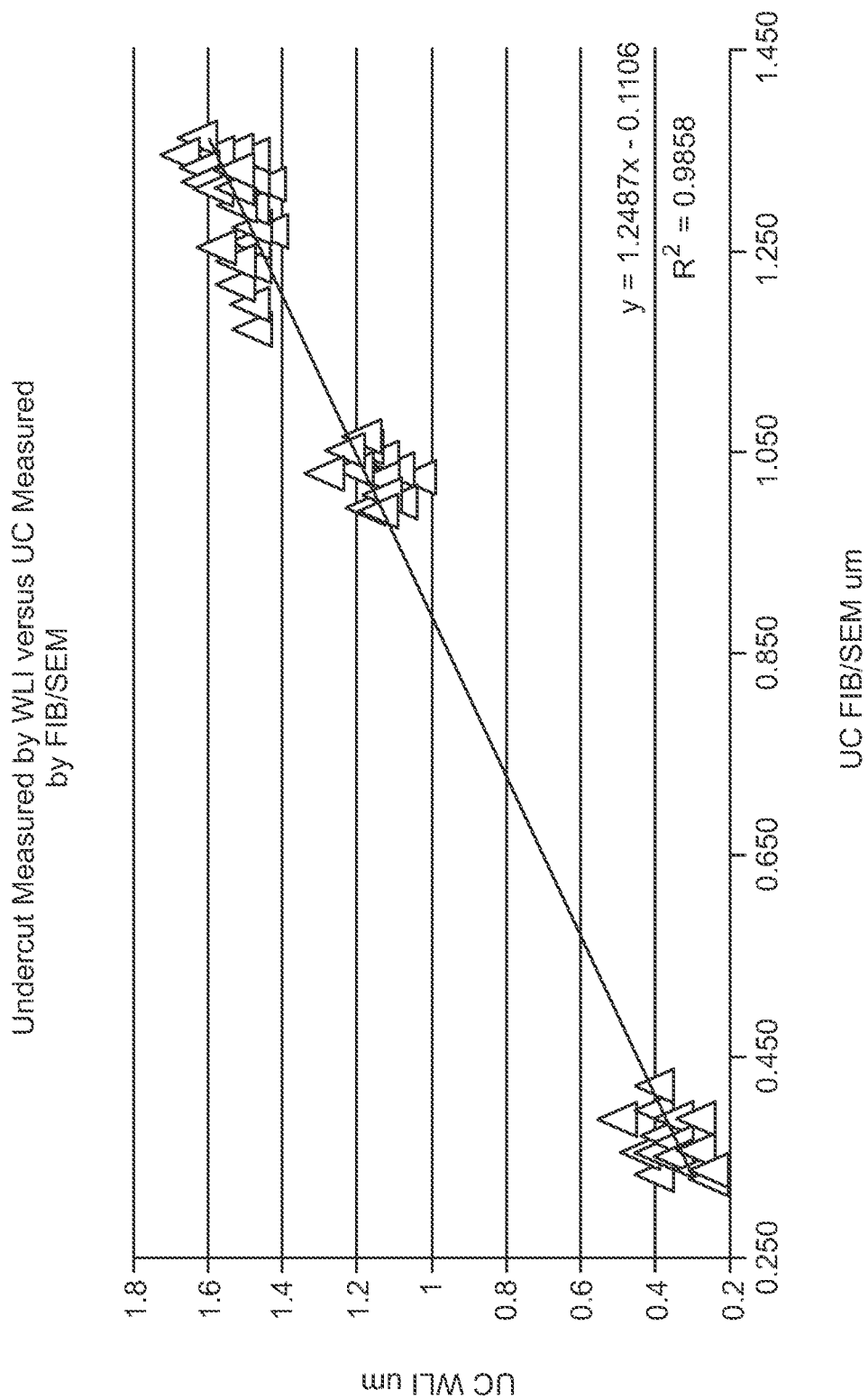
FIG. 7 is a graph of measurements taken using an inventive white light interferometry scan method, depicted on the vertical axis, correlated with a comparative method, depicted on the horizontal axis, that shows substantially accurate measurement data can be obtained using the inventive white light interferometry scan method as compared to conventional methods in accordance with one embodiment of the invention.

FIG. 7 is a graph of measurements taken using an inventive white light interferometry scan method (UC WLI), depicted on the vertical axis, correlated with a comparative method (UC FIB/SEM), depicted on the horizontal axis, that shows substantially accurate measurement data can be obtained using the inventive white light interferometry scan method as compared to conventional methods in accordance with one embodiment of the invention. More specifically, FIG. 7 shows undercut measurement by white light interferometry (UC WLI on vertical axis) and by SEM after FIB sectioning (UC FIB/SEM on horizontal axis). Both undercut measurements are made in microns or "um". Among other things, FIG. 7 shows that the white-light interferometry (WLI) may be used for undercut metrology as the measured WLI undercut values display a linear relationship (e.g., about linear) to those of FIB/SEM for undercut values above about 0.3 microns (um). The equation for the fitted line is shown in the lower right area of the graph of FIG. 7 along with the R squared value (e.g., coefficient of determination) reflecting the degree of the correlation of the data to a line.

FIG. 8a illustrates top and cross sectional views of a first bi-layer structure 502 having an undercut to be measured using white light interferometry along with graphs of the corresponding measurements (interferograms) of the outer edges ("Edge profile") 504 and the inner edges ("Peak profile") 506 in accordance with one embodiment of the invention. This first bi-layer structure 502 and corresponding edge profile interferogram 504 and peak profile interferogram 506 are similar to those described above for FIGS. 2a, 2b, 5b, 5c, 6b, and 6c.

FIG. 8b illustrates top and cross sectional views of two adjacent bi-layer structures (602a, 602b) having an undercut to be measured using white light interferometry along with graphs of the corresponding measurements (interferograms) of the outer edges ("Edge profile") 604 and the inner edges ("Peak profile") 606 in accordance with one embodiment of the invention. If the process of FIG. 3 were applied to the two adjacent bi-layer structures (602a, 602b) of FIG. 8b, the performing the first scan in block 202 would involve performing the first scan of the first bi-layer structure (e.g., 602a) and the second bi-layer structure (e.g., 602b) with the microscope using the first scan range. In such case, the performing the second scan in block 206 would then involve performing the second scan of the first bi-layer structure (e.g., 602a) and the second bi-layer structure (e.g., 602b) with the microscope using the second scan range.

In addition, the features of the first interferogram (e.g., edge profile 604) would include four edges (e.g., 604a, 604b, 604c, 604d) each corresponding to a portion of the first interferogram having a maximum slope. In such case, two edges (e.g., 604a, 604b) of the four edges of the first interferogram correspond in position to outer edges of the upper layer of the first bi-layer structure (e.g., 602a). The other two edges (e.g., 604c, 604d) of the four edges of the first interferogram correspond in position to outer edges of the upper layer of the second bi-layer structure (e.g., 602b). Similarly, the features of the second interferogram (e.g., peak profile 606) would include four peaks (e.g., 606a, 606b, 606c, 606d) each corresponding to a point of the second interferogram having a peak amplitude. In such case, two peaks (e.g., 606a, 606b) of the four peaks of the second interferogram correspond in position to outer edges of the lower layer of the first bi-layer structure (e.g., 602a). The other two peaks (e.g., 606c, 606d) of the four peaks of the second interferogram correspond in position to outer edges of the lower layer of the second bi-layer structure (602b).

Figure 9B:
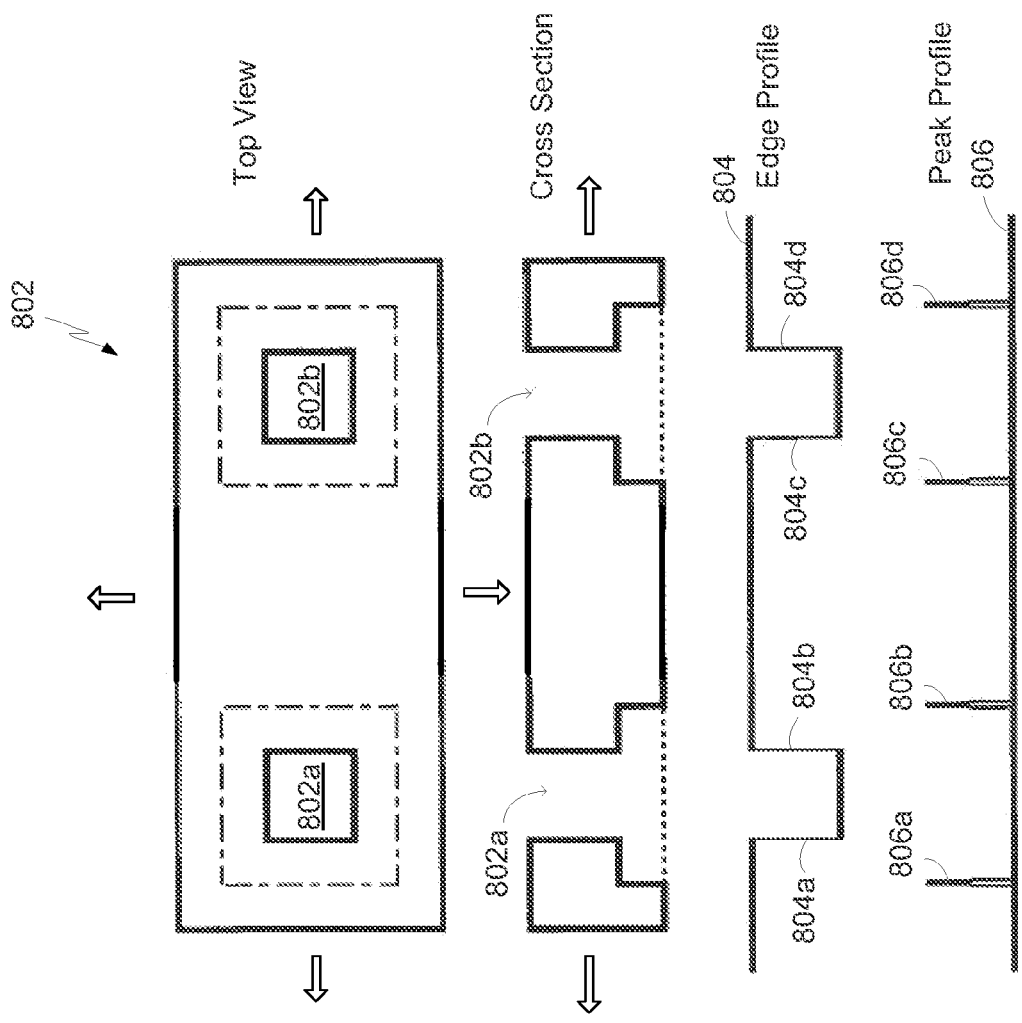
FIG. 9b illustrates top and cross sectional views of a bi-layer structure having undercuts associated with two centrally disposed holes to be measured using white light interferometry along with graphs of the corresponding measurements (interferograms) of the outer edges ("Edge profile") and the inner edges ("Peak profile") in accordance with one embodiment of the invention.
Figure 9A:
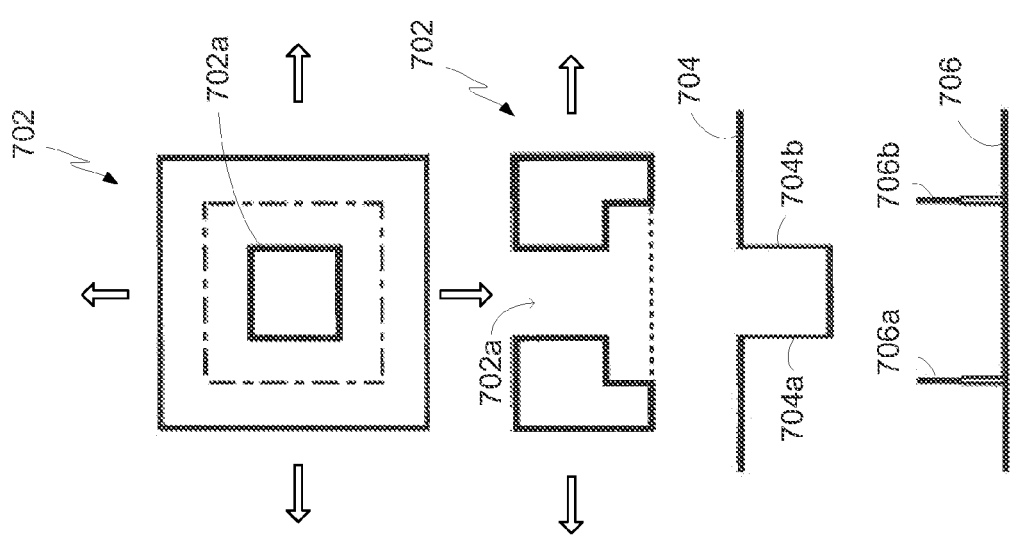
FIG. 9a illustrates top and cross sectional views of a second bi-layer structure having an undercut associated with a centrally disposed hole to be measured using white light interferometry along with graphs of the corresponding measurements (interferograms) of the outer edges ("Edge profile") and the inner edges ("Peak profile") in accordance with one embodiment of the invention.

FIG. 9a illustrates top and cross sectional views of a second bi-layer structure 702 having an undercut associated with a centrally disposed hole 702a to be measured using white light interferometry along with graphs of the corresponding measurements (interferograms) of the outer edges ("Edge profile") 704 and the inner edges ("Peak profile") 706 in accordance with one embodiment of the invention. The second bi-layer structure 702 has an upper layer cantilevered over a lower layer, where an area of the lower layer is less than that of the upper layer. The hole 702a extends through both the upper layer and the lower layer. The edge profile interferogram 704 includes two edges (704a, 704b) which correspond in position to edges of the upper layer (e.g., inner edges) defining the hole 702a. The peak profile interferogram 706 includes two peaks (706a, 706b) which correspond in position to edges of the lower layer defining the hole 702a. While FIG. 9a depicts the second bi-layer structure 702 as having a certain size, it is noted that the hollowed arrows extending from the second bi-layer structure 702 are meant to show that it may extend substantially beyond the depicted outer boundaries.

FIG. 9b illustrates top and cross sectional views of a bi-layer structure 802 having undercuts associated with two centrally disposed holes (802a, 802b) to be measured using white light interferometry along with graphs of the corresponding measurements (interferograms) of the outer edges ("Edge profile") 804 and the inner edges ("Peak profile") 806 in accordance with one embodiment of the invention. The bi-layer structure 802 has an upper layer cantilevered over a lower layer, where an area of the lower layer is less than that of the upper layer. The two holes (802a, 802b) of the bi-layer structure 802 extend through both the upper layer and the lower layer.

The first two edges (804a, 804b) of the four edges (804a, 804b, 804c, 804d) of the edge profile interferogram 804 correspond in position to edges of the upper layer of the bi-layer structure 802 defining the first hole 802a. The second two edges (804c, 804d) of the four edges (804a, 804b, 804c, 804d) of the edge profile interferogram 804 correspond in position to edges of the upper layer of the bi-layer structure 802 defining the second hole 802b.

Similarly, the first two peaks (806a, 806b) of the four peaks (806a, 806b, 806c, 806d) of the peak profile interferogram 806 correspond in position to edges of the lower layer of the bi-layer structure 802 defining the first hole 802a. The second two peaks (806c, 806d) of the four peaks (806a, 806b, 806c, 806d) of the peak profile interferogram 806 correspond in position to edges of the lower layer of the bi-layer structure 802 defining the second hole 802b.

While FIG. 9b depicts the second bi-layer structure 802 as having a certain size, it is noted that the hollowed arrows extending from the second bi-layer structure 802 are meant to show that it may extend substantially beyond the depicted outer boundaries. It is also noted that holes 802a and 802b are located centrally along the vertical direction across the second bi-layer structure 802.

While FIGS. 8a, 8b, 9a, and 9b depict various embodiments of bi-layer structures, the inventive systems and methods described herein can be applied to other bi-layer structures having an undercut that might need to be measured.

Aspects of the proposed techniques can include a number of advantages over the traditional FIB/SEM methods. For example, the proposed methods are non-destructive, meaning that devices are not typically destroyed in the measurement process. On the other hand, the FIB/SEM methods are destructive. Throughput per device using the proposed methods can be about 10 seconds, while throughput per device can be about 10 minutes using the FIB/SEM methods. Thus the proposed methods can be about 60 times faster than the conventional methods. Capital requirements for the proposed methods are much lower than with the FIB/SEM methods, even if the throughput were the same. More specifically, the FIB/SEM systems typically cost about several million dollars versus a few hundred thousand dollars for a WLI system that can be used to administer the proposed methods. Furthermore, annual service expenses for a FIB/SEM system are on the order of one hundred thousand dollars per year versus perhaps several thousand dollars for a WLI system. As such, these throughput and capital advantages for the proposed methods can encourage more sampling and thus better yield.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The terms "above," "below," and "between" as used herein refer to a relative position of one layer with respect to other layers. As such, one layer deposited or disposed above or below another layer may be directly in contact with the other layer or may have one or more intervening layers. Moreover, one layer deposited or disposed between layers may be directly in contact with the layers or may have one or more intervening layers.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A method for measuring an undercut of bi-layer structures on a wafer, the method comprising:

performing a first scan of a first bi-layer structure having an upper layer disposed on a lower layer with a microscope using a first scan range corresponding to a first depth of scanning, wherein the microscope is configured for white light interferometry;

generating a first interferogram using data from the first scan;

performing a second scan of the first bi-layer structure with the microscope using a second scan range corresponding to a second depth of scanning different than the first depth of scanning;

generating a second interferogram using data from the second scan;

determining a first distance between first features of the first interferogram, the first features corresponding to respective physical edges of one of the upper layer or the lower layer of the bi-layer structure;

determining a second distance between second features of the second interferogram, the second features corresponding to respective physical edges of the other of the upper layer or the lower layer of the bi-layer structure; and calculating a width of the undercut based on the first distance and the second distance.

2. The method of claim 1, wherein the first scan range is less than the second scan range, wherein the first and second ranges extend in a direction that is about normal to a top surface of the first bi-layer structure.

3. The method of claim 2:

wherein the first features of the first interferogram comprise two interferogram edges each corresponding to a portion of the first interferogram having a maximum slope; and wherein the second features of the second interferogram comprise two peaks each corresponding to a point of the second interferogram having a peak amplitude.

4. The method of claim 3:

wherein an area of the lower layer is less than that of the upper layer;

wherein the two interferogram edges of the first interferogram correspond in position to outer physical edges of the upper layer; and wherein the two peaks of the second interferogram correspond in position to outer physical edges of the lower layer.

5. The method of claim 3:

wherein an area of the lower layer is less than that of the upper layer;

wherein the first bi-layer structure comprises a centrally disposed hole extending through both the upper layer and the lower layer;

wherein the two interferogram edges of the first interferogram correspond in position to the physical edges of the upper layer defining the hole; and wherein the two peaks of the second interferogram correspond in position to the physical edges of the lower layer defining the hole.

6. The method of claim 2:

wherein the first features of the first interferogram comprise four interferogram edges each corresponding to a portion of the first interferogram having a maximum slope;

wherein the second features of the second interferogram comprise four peaks each corresponding to a point of the second interferogram having a peak amplitude;

wherein the performing the first scan of the first bi-layer structure with the microscope using the first scan range comprises performing the first scan of the first bi-layer structure and a second bi-layer structure with the microscope using the first scan range; and wherein the performing the second scan of the first bi-layer structure with the microscope using the second scan range comprises performing the second scan of the first bi-layer structure and the second bi-layer structure with the microscope using the second scan range.

7. The method of claim 6:

wherein an area of the lower layer of the first bi-layer structure is less than that of the upper layer of the first bi-layer structure;

wherein the second bi-layer structure comprises an upper layer on a lower layer, where an area of the lower layer of the second bi-layer structure is less than that of the upper layer of the second bi-layer structure;

wherein a first two interferogram edges of the four interferogram edges of the first interferogram correspond in position to outer physical edges of the upper layer of the first bi-layer structure;

wherein a second two interferogram edges of the four interferogram edges of the first interferogram correspond in position to outer physical edges of the upper layer of the second bi-layer structure;

wherein a first two peaks of the four peaks of the second interferogram correspond in position to outer physical edges of the lower layer of the first bi-layer structure; and wherein a second two peaks of the four peaks of the second interferogram correspond in position to outer physical edges of the lower layer of the second bi-layer structure.

8. The method of claim 2:

wherein the first features of the first interferogram comprise four interferogram edges each corresponding to a portion of the first interferogram having a maximum slope;

wherein the second features of the second interferogram comprise four peaks each corresponding to a point of the second interferogram having a peak amplitude;

wherein an area of the lower layer of the first bi-layer structure is less than that of the upper layer of the first bi-layer structure;

wherein the first bi-layer structure comprises a first hole and a second hole, each extending through both the upper layer and the lower layer;

wherein a first two interferogram edges of the four interferogram edges of the first interferogram correspond in position to a first two physical edges of the upper layer of the first bi-layer structure defining the first hole;

wherein a second two interferogram edges of the four interferogram edges of the first interferogram correspond in position to a second two physical edges of the upper layer of the first bi-layer structure defining the second hole;

wherein a first two peaks of the four peaks of the second interferogram correspond in position to a first two physical edges of the lower layer of the first bi-layer structure defining the first hole; and wherein a second two peaks of the four peaks of the second interferogram correspond in position to a second two physical edges of the lower layer of the first bi-layer structure defining the second hole.

9. The method of claim 1, wherein the second scan range is less than the first scan range, wherein the first and second ranges extend in a direction that is about normal to a top surface of the first bi-layer structure.

10. The method of claim 1, further comprising modifying a fabrication process for forming the first bi-layer structure if the width of the undercut is outside of a preselected range.

11. The method of claim 10, wherein the modifying the fabrication process comprises adjusting a duration of a development sub-process used in forming the undercut of the first bi-layer structure.

12. The method of claim 1:
wherein the performing the first scan of the first bi-layer structure with the microscope using the first scan range comprises:
providing the wafer;
depositing polymethylglutarimide (PMGI) on the wafer to form the lower layer;
depositing photo resist on the lower layer to form the upper layer;
patterning the lower layer and the upper layer, where the patterning comprises developing the lower layer and the upper layer to form the first bi-layer structure; and
performing the first scan of the first bi-layer structure with the microscope using the first scan range.

* * * * *